United States Patent
Okajima

(10) Patent No.: US 7,135,810 B2
(45) Date of Patent: Nov. 14, 2006

(54) SURFACE MOUNT CRYSTAL OSCILLATOR

(75) Inventor: Yukihiro Okajima, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/921,442

(22) Filed: Aug. 19, 2004

(65) Prior Publication Data
US 2005/0040735 A1 Feb. 24, 2005

(30) Foreign Application Priority Data
Aug. 20, 2003 (JP) ............................. 2003-295873
Jun. 22, 2004 (JP) ............................. 2004-183261

(51) Int. Cl.
H01L 41/053 (2006.01)
H03B 5/32 (2006.01)

(52) U.S. Cl. ...................... 310/348; 310/340; 331/158

(58) Field of Classification Search ................ 310/348, 310/315, 341, 346, 340; 331/68, 158
See application file for complete search history.

(56) References Cited

U.S. PATENT DOCUMENTS 6,229,249 B1 * 5/2001 Hatanaka et al. ........... 310/348
6,229,404 B1 * 5/2001 Hatanaka ...................... 331/68
6,587,008 B1 * 7/2003 Hatanaka et al. ............. 331/68
6,798,307 B1 * 9/2004 Mizumura et al. .......... 331/158
6,882,232 B1 * 4/2005 Harima ........................ 331/68
6,967,537 B1 * 11/2005 Harima et al. ................ 331/68
2003/0210102 A1 * 11/2003 Harima et al. ............... 331/158
2004/0056729 A1 * 3/2004 Sakaba et al. ............... 331/158

FOREIGN PATENT DOCUMENTS

JP          2002-280835          9/2002

* cited by examiner

Primary Examiner—Darren Schuberg
Assistant Examiner—Derek Rosenau
(74) Attorney, Agent, or Firm—Knobbe Martens Olson & Bear, LLP

(57) ABSTRACT

A surface mount quartz crystal oscillator comprises a package body having a recess, a quartz crystal blank having extending electrodes extending from the outer periphery of the crystal blank, an IC (integrated circuit) chip secured to an inner bottom surface of the recess and having at least an oscillator circuit connected to the crystal blank, and an insulator disposed on the IC chip. A pair of conduction terminals are disposed on an inner wall surface of the recess and electrically connected to the IC chip. The crystal blank is secured to the insulator with a conductive adhesive at positions from which the extending electrodes are extended, and the conductive adhesive electrically connects each extending electrode to one conduction terminal associated therewith.

17 Claims, 3 Drawing Sheets

SURFACE MOUNT CRYSTAL OSCILLATOR

BACKGROUND OF THE INVENTION

1. Field of the Invention

The present invention relates to a surface mount quartz crystal oscillator, and more particularly, to a surface mount crystal oscillator which facilitates a reduction in size.

2. Description of the Related Art

A surface mount crystal oscillator which accommodates a quartz crystal unit and an oscillator circuit using the crystal unit in a surface mount package has been widely used, particularly for portable electronic devices as a frequency or a time reference source because of its small size and light weight. In recent years, an increasing reduction in size has been rapidly advanced in a variety of portable devices represented by portable telephones, causing an associated reduction in size of surface mount crystal oscillators.

A conventional surface mount crystal oscillator illustrated in FIG. 1A employs package body 1 formed with a recess which receives IC (integrated circuit) chip 2 and quartz crystal blank 3, and cover 4 which is placed over the recess for closing the same to hermetically encapsulate IC chip 2 and crystal blank 3 within package body 1.

Steps are formed in the inner wall of the recess of package body 1. Package body 1 is made of a three-layered laminated ceramics comprising a bottom plate, a first frame wall corresponding to the steps and a second frame wall corresponding to a portion of the recess above the steps. The frame wall refers to a frame-shaped member which has an opening corresponding to the recess. IC terminals, not shown, are formed at appropriate positions on the bottom of the recess for use in connection to IC chip 2. Also, a pair of crystal terminals, not shown, are formed on one step, as shown, in the recess of package body 1 for use in connection to crystal blank 3. Further, conductive paths (i.e., wiring pattern), not shown, are formed in package body 1 for connecting the IC terminals to the crystal terminals.

IC chip 2 has an oscillator circuit integrated therein which is connected to crystal blank 3 to make up an oscillator, and is connected to the IC terminals using bumps 5, for example, by ultrasonic thermo-compression bonding hence secured to the inner bottom surface of the recess of package body 1.

Crystal blank 3, which is comprised, for example, of an AT-cut quartz crystal blank, is substantially rectangular in shape as illustrated in FIG. 1B, and is formed with excitation electrodes 6 in central regions of both main surfaces, respectively. Extending electrodes 7a, 7b are extended from a pair of excitation electrodes 6 toward both ends on one shorter side of crystal blank 3, respectively. The leading end 24 of each extending electrode 7a, 7b is folded over onto the opposite main surface of crystal blank 3. Crystal blank 3 is secured with conductive adhesive 8 at both sides of one end thereof, on which extending electrodes 7a, 7b are extended, on the step, on which the crystal terminals are formed. In this event, crystal blank 3 is secured while the other end of crystal blank 3 is carried on the other step, as shown. In this way, crystal blank 3 is connected between an input terminal and an output terminal of an oscillation amplifier within IC chip 2 through the crystal terminals, conductive paths routed on package body 1, and the IC terminals.

At four corners on the bottom of package body 1, mounting electrodes (not shown) are formed for use in surface-mounting the crystal oscillator on a wiring board. The mounting electrodes also extend off outer side surfaces of package body 1. The mounting electrodes, which will serve as a power supply terminal, a ground terminal, an output terminal, and the like of the crystal oscillator, are electrically connected to IC chip 2 through conductive paths, not shown, and the IC terminals.

In the foregoing crystal oscillator, however, crystal blank 3 has one end held on one step within the recess of package body 1, and the other end carried on the other step, so that the resulting crystal oscillator has a problem of large outer dimensions. With the use of an AT-cut quartz crystal blank which has a thickness shear vibration mode, the crystal blank itself can be fairly reduced in size. However, in the structure described above, crystal blank 3 must be mounted to straddle IC chip 2, so that crystal blank 3 must have a horizontal length, as shown, larger than the horizontal length, as shown, of IC chip 2. Actually, slow progress of reduction in size of IC chip 2 eventually results in difficulties in reduction in size of a crystal oscillator.

To solve the foregoing problem, Japanese Patent Laid-open Application No. 2002-280835 (JP, P2002-280835A) proposes a crystal oscillator, as illustrated in FIG. 2, in which a crystal blank has one end secured on a step in a recess of package body 1 and the other end carried on a spacer disposed on IC chip 2. The crystal oscillator thus constructed can be reduced in size because the other step is eliminated within a pair of steps in the recess of package body 1.

However, even in the structure illustrated in FIG. 2, a step required for disposing the crystal terminals causes the crystal oscillator to have an outer planar size much larger than the size of IC chip 2, thus inhibiting the reduction in size of the crystal oscillator.

SUMMARY OF THE INVENTION

It is therefore an object of the present invention to provide a surface mount crystal oscillator which facilitates a reduction in size thereof.

The object of the present invention is achieved by a crystal oscillator which includes a package body having a recess, a crystal blank having extending electrodes extending from the outer periphery of the crystal blank, an IC (integrated circuit) chip secured to an inner bottom surface of the recess and having at least an oscillator circuit connected to the crystal blank, an insulator disposed on the IC chip, and conduction terminals disposed on an inner wall surface of the recess and electrically connected to the IC chip, wherein the crystal blank is secured to the insulator with a conductive adhesive at positions from which the extending electrodes are extended, and the conductive adhesive electrically connects the extending electrodes to the conduction terminals, respectively.

In the present invention, the crystal oscillator may preferably employ, for example, an AT-cut quartz crystal blank as the crystal blank. A pair of extending electrodes of the crystal blank are preferably extended to both sides at one edge of the crystal blank. When such a crystal blank is used, the recess may be formed substantially in the rectangular parallelepiped shape, and a pair of conduction terminals are formed on both sides of an inner wall surface at one longitudinal end of the recess, or on both opposing side surfaces along the longitudinal direction of the recess near one end of the recess.

With the employment of the crystal blank having the extending electrodes extended to both sides on one edge thereof, the crystal blank securely cantilevered, thereby maintaining satisfactory vibration characteristics of the crystal blank.

In the present invention, the crystal oscillator can preferably employ the insulator which is a insulator substrate on which a pair of crystal terminals are disposed corresponding to the positions at which the pair of extending electrodes are formed. The crystal terminals thus disposed can further ensure the electric connection of the conduction terminals to the crystal blank.

In the present invention, since the crystal blank is placed on the insulator disposed on the IC chip, it is not necessary to form a step in the package body to secure the crystal blank to the step. Consequently, the crystal oscillator can be reduced in outer planar dimensions, thus facilitating a reduction in size of surface-mount type crystal oscillators.

DETAILED DESCRIPTION OF THE PREFERRED EMBODIMENTS

Figure 1A:
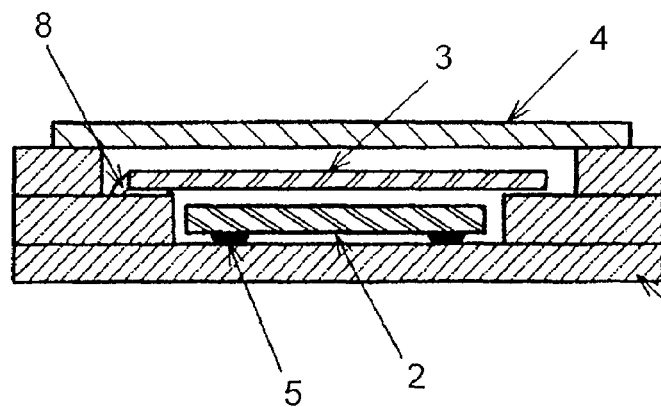
FIG. 1A is a cross-sectional view illustrating a conventional surface mount crystal oscillator.
Figure 3A:
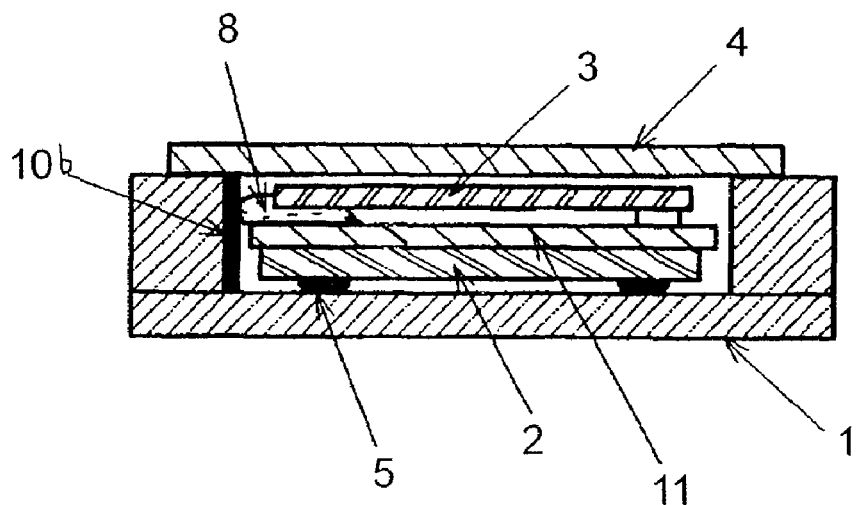
FIG. 3A is a cross-sectional view illustrating a surface mount crystal oscillator according to one embodiment of the present invention.
Figure 3B:
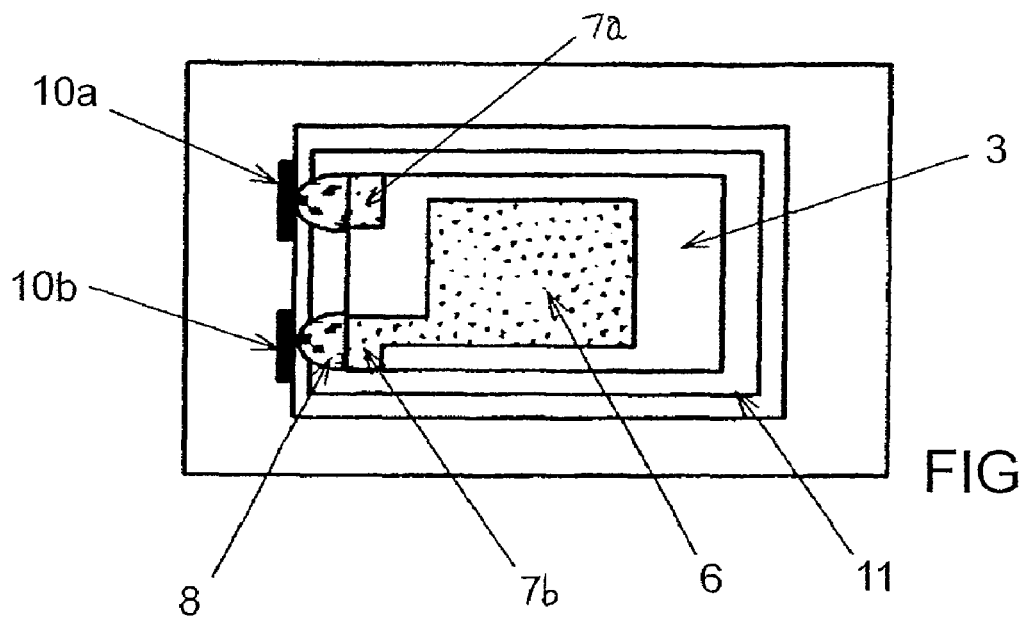
FIG. 3B is a plan view of the crystal oscillator illustrated in FIG. 3A when a cover is removed.
Figure 3C:
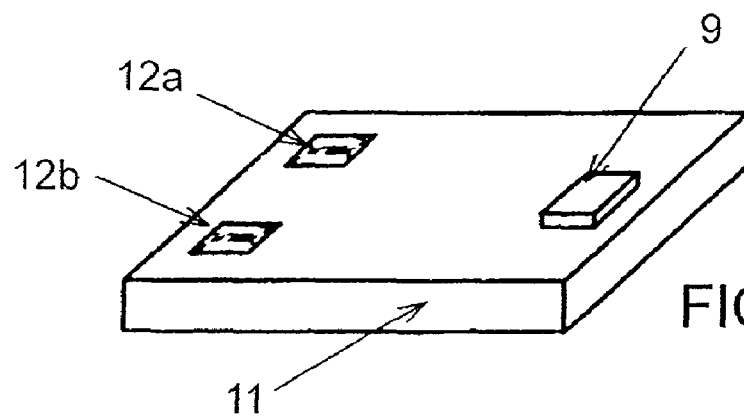
FIG. 3C is a perspective view illustrating a substrate for use in the crystal oscillator illustrated in FIG. 3A.

In FIGS. 3A to 3C which illustrate a surface mount crystal oscillator according to one embodiment of the present invention, components identical to those in FIG. 1A are designated the same reference numerals, so that repetitive discussions are simplified or omitted in the following description.

Figure 1B:
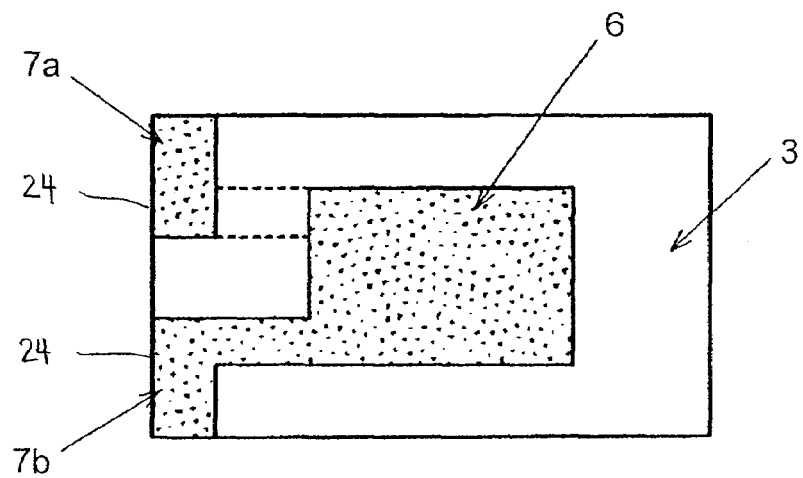
FIG. 1B is a plan view of a crystal blank.
Figure 2:
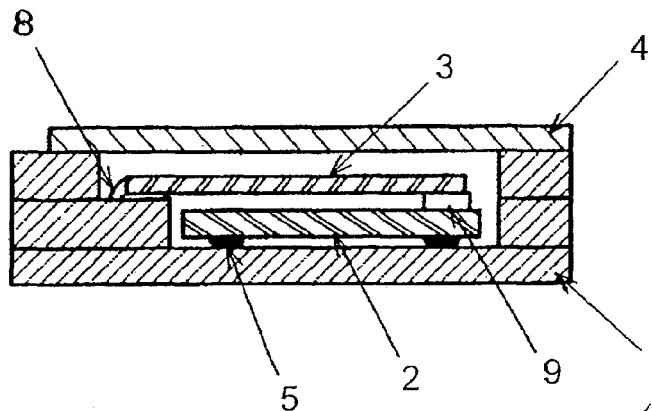
FIG. 2 is a cross-sectional view illustrating another conventional surface mount crystal oscillator.

As described above, the surface mount quartz crystal oscillator illustrated in FIGS. 3A to 3C comprises package body 1 having a recess; IC (integrated circuit) chip 2 having an oscillator circuit integrated therein; crystal blank 3 (see FIG. 1B) having extending electrodes 7a, 7b extending from both ends of one edge thereof; and cover 4 for enclosing the recess. IC chip 2 and crystal blank 3 are contained in the recess of package body 1, and cover 4 is placed over the recess to hermetically encapsulate IC chip 2 and crystal blank 3 within package body 1. Unlike the crystal oscillator illustrated in FIG. 1A, the crystal oscillator of the present embodiment is not formed with any step in the inner wall of the recess of package body 1. The recess is formed substantially in the rectangular parallelepiped shape. Therefore, package body 1 is comprised of two-layered laminated ceramics having a bottom plate and a frame wall. The number of laminated layers in the laminate ceramics is smaller by one than the conventional crystal oscillator illustrated in FIG. 1A.

A pair of conduction terminals 10a, 10b, extending in the vertical direction, are disposed on one of side surfaces, which define the recess, positioned at one end of the recess in the longitudinal direction. Conduction terminals 10a, 10b are formed by through-holes processing along the sides of both ends of the side surface. Conduction terminals 10a, 10b are electrically connected to IC terminals (not shown) disposed on the bottom of the recess through a wiring pattern, not shown.

IC chip 2 is connected to the IC terminals using bumps 5 by ultrasonic thermo-compression bonding in a similar manner to the foregoing, and hence secured on the inner bottom surface of package body 1. Thus, conductive patterns 10a, 10b are electrically connected to IC chip 2.

Substrate 11 made of, for example, ceramic is bonded onto IC chip 2 with an adhesive or the like, not shown, as an insulator. As illustrated in FIG. 3C, a pair of crystal terminals 12a, 12b are disposed on both sides along one edge on the surface of substrate 11, while spacer or pillow member 9 is disposed near the opposing edge. Spacer 9 may be formed, for example, of ceramic, resin, or the like, or formed by applying an insulating coating on substrate 11. Crystal blank 3 is secured to such substrate 11 with conductive adhesive 8. Crystal blank 3 has extending electrodes 7a, 7b extending from both sides of one edge thereof. Specifically, extending electrodes 71, 7b are secured to crystal terminals 12a, 12b, respectively, with conductive adhesive 8. In this event, conductive adhesive 8 for connecting extending electrode 7a to crystal terminal 12a makes an electric connection with conduction terminal 10a on the inner wall of the recess. Likewise, conductive adhesive 8 for connecting extending electrode 7b to crystal terminal 12b makes an electric connection with conduction terminal 10b on the inner wall of the recess.

These are formed by placing the other edge of crystal blank 3 on spacer 9, applying liquid conductive adhesive 8 on crystal terminals 12a, 12b in contact with conduction terminals 10a, 10b, respectively, and bringing the one edge of crystal blank 3 into contact with conductive adhesive 8. Since conductive adhesive 8 has viscosity, conductive adhesive 8 will not flow out through a gap, if any, between the inner wall surface of package body 1 and substrate 11.

Alternatively, after crystal blank 3 is secured to substrate 11 at both sides of the one edge with conductive adhesive 8 or the like, and the resulting substrate 11 is bonded on IC chip 2, conduction terminals 10a, 10b may be electrically connected to crystal terminals 12a, 12b, respectively, with conductive adhesive 8.

In the crystal oscillator of the present embodiment, no step is required in the inner wall of package body 1, and crystal blank 3 smaller in size than IC chip 2 can be placed on substrate 11. It is therefore possible, according to the present invention, to achieve a further reduction in size of the surface mount crystal oscillator.

In the crystal oscillator described above, conduction terminals 10a, 10b are disposed along both sides on one side surface of the recess in package body 1 at one end of the recess in the longitudinal direction. However, the positions at which conduction terminals 10a, 10b are formed are not limited to the foregoing positions.

Figure 4A:
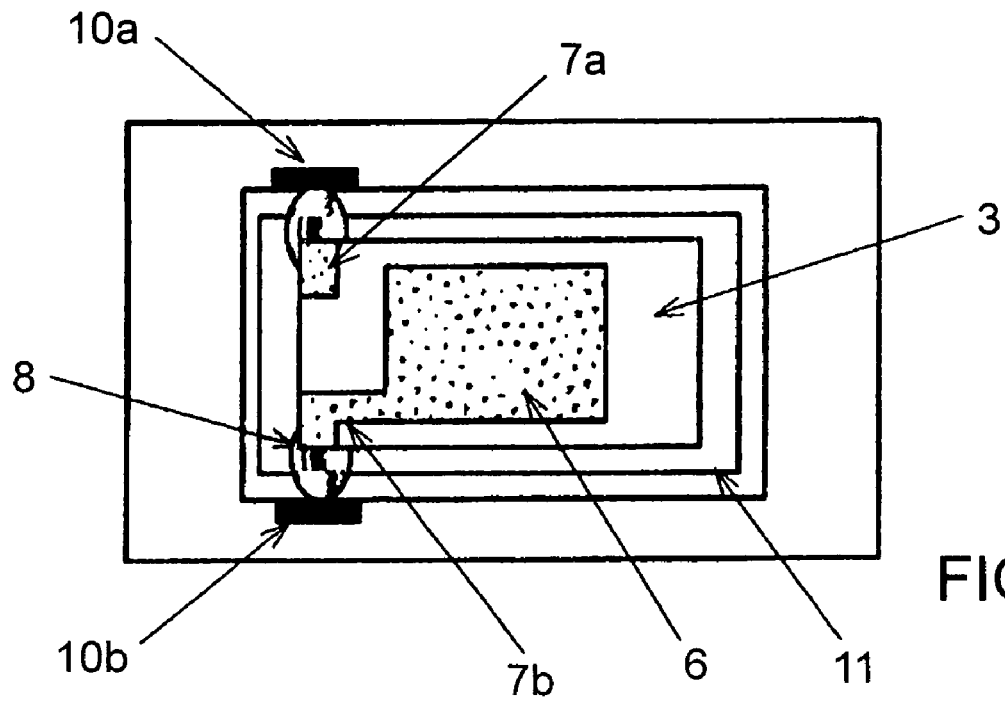
FIG. 4A s a plan view illustrating a surface mount crystal oscillator according to another embodiment of the present invention when a cover is removed.

In a crystal oscillator illustrated in FIG. 4A, conduction terminals 10a, 10b are disposed on both side surfaces extending in the longitudinal direction of the recess. Since extending electrodes 7a, 7b of crystal blank 3 are disposed on both ends of one edge of crystal blank 3, conduction terminals 10a, 10b are formed to extend along the opposing sides of the recess in the longitudinal direction near one end of said recess. By thus disposing conduction terminals 10a, 10b along both side surfaces of the recess extending in the longitudinal direction, a sufficient distance can be ensured between both conductive adhesives, thus preventing electric short-circuiting between the conductive adhesives.

Alternatively, conductive adhesive 8 may be applied over corners of the inner walls to enhance a bonding strength resulting from a direct contact of conductive adhesive 8 with the ceramic ground, thereby ensuring the electric contact.

Figure 4B:
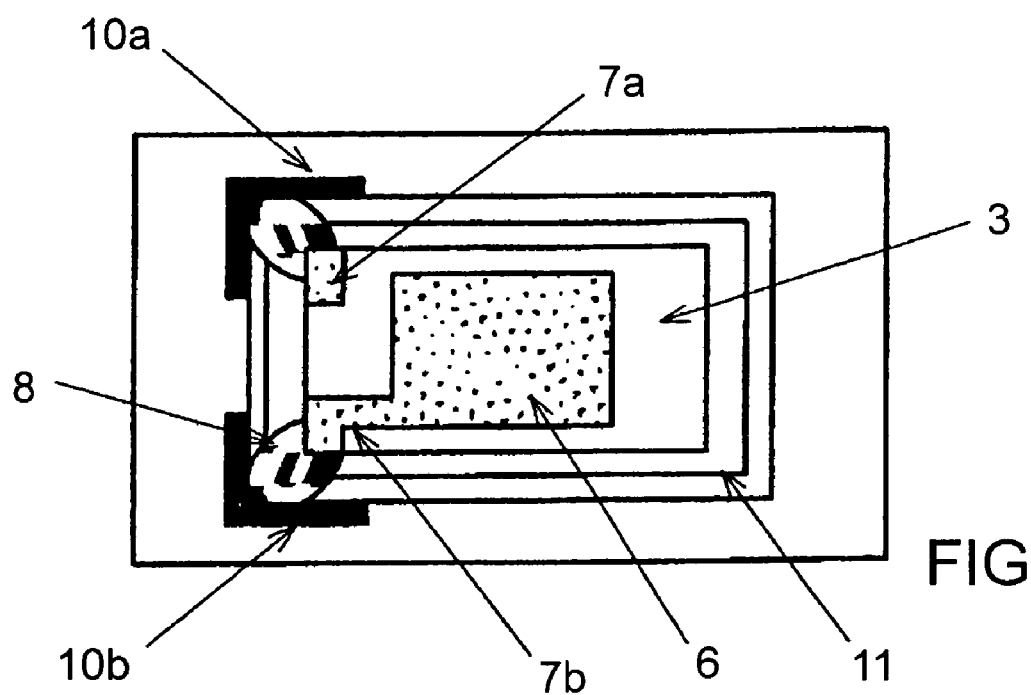
FIG. 4B is a plan view illustrating a surface mounted crystal oscillator according to a further embodiment of the present invention when a cover is removed.

A crystal oscillator illustrated in FIG. 4B is a modification to the crystal oscillator illustrated in FIG. 3A, where conduction terminals 10*a*, 10*b* disposed on both sides of an end surface on one end side in the longitudinal direction of the recess are additionally extended along both side surfaces running in the longitudinal direction of the recess. When a pair of conduction terminals 10*a*, 10*b* are provided to extend beyond the corners at both ends of the side, each of conduction terminals 10*a*, 10*b* is adhered over a wider area of conductive adhesive 8 to provide a more secure electric connection.

In the respective examples described above, spacer 9 is disposed near the opposing edge of substrate 11, but spacer 9 may not be necessarily provided. However, spacer 9 is preferably provided for facilitating the operation for securing crystal blank 3 to substrate 11.

In this embodiment, substrate 11 made of an insulating material is provided for preventing electric short-circuiting between a semiconductor substrate, which forms part of IC chip 2, and crystal blank 3. If an employed semiconductor substrate is formed with a thick insulating film on the surface opposite to that on which elements are formed, crystal blank 3 may be secured on the insulating film as it is without using a separate insulator substrate. In this event, no crystal terminals need be disposed on the insulating film of the semiconductor substrate, but extending electrodes 7*a*, 7*b* can be directly connected to conduction terminals 10*a*, 10*b* through conductive adhesive 8.

While crystal blank 3 employed in the foregoing embodiment has extending electrodes 7*a*, 7*b* extending from both sides on one edge of crystal blank 3, as illustrated in FIG. 3B, another crystal blank which can be employed in the crystal oscillator of the present invention may be provided with excitation electrodes on both main surfaces thereof, with extending electrodes extended from the respective excitation electrodes toward a pair of opposing sides. Such a crystal blank, when used, are held on both sides. However, the crystal blank is more affected by a holding system implemented by the conductive adhesive or the like as it is smaller in outer shape. Therefore, the crystal blank is preferably cantilevered with the opposing edge left free to avoid the influence of the holding and maintain satisfactory vibration characteristics.

What is claimed is:

1. A crystal oscillator comprising:
   a package body having a recess formed by an inner side wall surface and an inner bottom surface surrounded by the inner side walls;
   a crystal blank having extending electrodes extending from an outer periphery of said crystal blank;
   an IC chip secured to the inner bottom surface of said recess and having at least an oscillator circuit connected to said crystal blank;
   an insulator bonded onto an upper surface of said IC chip; and
   conduction terminals disposed on the inner side wall surface of said recess and electrically connected to said IC chip,
   wherein both said crystal blank and said IC chip are accommodated in said recess, wherein said crystal blank is secured to said insulator with a conductive adhesive at positions from which extending electrodes are extended, and said conductive adhesive electrically connects each of said extending electrodes with each of said conduction terminals.

2. The crystal oscillator according to claim 1, wherein said crystal blank comprises excitation electrodes disposed on both main surfaces of said crystal blank, respectively, and a pair of said extending electrodes extended respectively from said excitation electrodes to said outer periphery of said crystal blank, and
   a pair of said conduction terminals are provided corresponding to said pair of extending electrodes.

3. The crystal oscillator according to claim 2, wherein said pair of extending electrodes are extended to both sides of one edge of said crystal blank.

4. The crystal oscillator according to claim 3, wherein said pair of conduction terminals are formed on both sides of an inner wall surface at one end of said recess.

5. The crystal oscillator according to claim 4, wherein said recess is formed substantially in a rectangular parallelepiped shape, and said one end of said recess is one longitudinal end of said recess.

6. The crystal oscillator according to claim 2, wherein said pair of extending electrodes are extended to both sides of one edge of said crystal blank, said recess is formed substantially in a rectangular parallelepiped shape, and said pair of conduction terminals are formed on both opposing longitudinal side surfaces of said recess near one end of said recess.

7. The crystal oscillator according to claim 1, further comprising a cover for enclosing said recess, such that said IC chip and said crystal blank are hermetically sealed within said recess.

8. The crystal oscillator according to claim 1, wherein said package body is comprised of a two-layered laminated ceramic.

9. The crystal oscillator according to claim 2, wherein said insulator comprises an insulator substrate, and one pair of crystal terminals are disposed on a surface of said insulator substrate corresponding to positions at which said pair of extending electrodes are formed.

10. The crystal oscillator according to claim 3, wherein a pair of crystal terminals are disposed on a surface of said insulator corresponding to the positions at which said pair of extending electrodes are formed.

11. The crystal oscillator according to claim 10, further comprising a spacer on the surface of said insulator corresponding to the other edge of said crystal blank which opposes said one edge.

12. The crystal oscillator according to claim 9, wherein said conductive adhesive secures said extending electrodes to said crystal terminals, respectively, and electrically connects said extending electrodes to said conduction terminals, respectively.

13. The crystal oscillator according to claim 10, wherein said conductive adhesive secures said extending electrodes to said crystal terminals, respectively, and electrically connects said extending electrodes to said conduction terminals, respectively.

14. A crystal oscillator comprising:
   a package body having a recess having an inner bottom surface surrounded by an inner side wall surface on which conduction terminals are disposed;
   an IC chip containing at least an oscillator circuit, secured to the inner bottom surface of the recess, said IC chip having a top surface and electrically connected to the conduction terminals;

an insulator plate bonded onto and covering the top surface of the IC chip;

a crystal blank having electrodes at its outer periphery, said crystal blank disposed above the insulator plate at an interval; and a conductive adhesive securing the crystal blank to the insulator plate at each electrode of the crystal blank and connecting each conduction terminal on the inner wall surface.

wherein both said crystal blank and said IC chip are accommodated in said recess.

15. The crystal oscillator according to claim 14, wherein the crystal blank is secured to the insulator plate at the electrodes and further at a side opposite to the electrodes with a spacer placed between the crystal blank and the insulator plate.

16. The crystal oscillator according to claim 14, wherein the inner wall surface of the recess has no step in a depth direction.

17. The crystal oscillator according to claim 14, wherein the insulator plate has a size larger than the IC chip and the crystal blank.

* * * * *